(12) United States Patent
Büthker et al.

(10) Patent No.: US 11,668,765 B2
(45) Date of Patent: Jun. 6, 2023

(54) DETECTION CIRCUIT AND INTEGRATED CIRCUIT

(71) Applicant: Datang NXP Semiconductors Co., Ltd., Jiangsu (CN)

(72) Inventors: Dick Büthker, Eindhoven (NL); Marijn van Dongen, Eindhoven (NL)

(73) Assignee: Datang NXP Semiconductors Co., Ltd., Jiangsu (CN)

( * ) Notice: Subject to any disclaimer, the term of this patent is extended or adjusted under 35 U.S.C. 154(b) by 0 days.

(21) Appl. No.: 17/736,936

(22) PCT Filed: Sep. 14, 2020

(86) PCT No.: PCT/CN2020/114980
§ 371 (c)(1),
(2) Date: May 4, 2022

(87) PCT Pub. No.: WO2021/088516
PCT Pub. Date: May 14, 2021

(65) Prior Publication Data
US 2022/0404437 A1 Dec. 22, 2022

(30) Foreign Application Priority Data
Nov. 5, 2019 (CN) .......................... 201911071688.1

(51) Int. Cl.
*G01R 31/64* (2020.01)
*G01R 19/10* (2006.01)

(52) U.S. Cl.
CPC ............. *G01R 31/64* (2020.01); *G01R 19/10* (2013.01)

(58) Field of Classification Search
CPC .... G01R 19/10; G01R 31/2851; G01R 31/54; G01R 31/64; G01R 27/2605; G01R 31/56; G01R 15/04
See application file for complete search history.

(56) References Cited

U.S. PATENT DOCUMENTS

| 6,151,560 | A | * | 11/2000 | Jones | ........................ H02H 3/12 |
| | | | | | 702/65 |
| 9,989,586 | B2 | * | 6/2018 | Liu | ........................ H02M 7/487 |

(Continued)

FOREIGN PATENT DOCUMENTS

| CN | 101122624 A | 2/2008 |
| CN | 101330284 A | 12/2008 |

(Continued)

*Primary Examiner* — Vinh P Nguyen
(74) *Attorney, Agent, or Firm* — Foley & Lardner LLP

(57) ABSTRACT

A detection circuit and an integrated circuit. The detection circuit is used for detecting the drift or an open circuit of a first capacitor (C1) on a filtered second power source terminal (220), and the second power source terminal (220) is suitable for acquiring a power source voltage from an unfiltered first power source terminal (210) by means of a first resistor (R1), and is suitable for being coupled to a reference electric potential terminal (230) by means of the first capacitor (C1). The detection circuit comprises a second resistor (R2) and a second capacitor (C2) that are connected in series and coupled between the first power source terminal (210) and the reference electric potential terminal (230), wherein the second resistor (R2) and the second capacitor (C2) have the same time constant as the first resistor (R1) and the first capacitor (C1).

19 Claims, 12 Drawing Sheets

(56) References Cited

U.S. PATENT DOCUMENTS 11,362,536 B2 *  6/2022  Snyder ................ H01M 10/482
2012/0286812 A1    11/2012  Lin et al.

FOREIGN PATENT DOCUMENTS

| CN | 101615588 A | 12/2009 |
| CN | 103675421 A | 3/2014 |
| CN | 104793677 A | 7/2015 |

* cited by examiner

DETECTION CIRCUIT AND INTEGRATED CIRCUIT

CROSS-REFERENCE TO RELATED APPLICATION

This application claims the benefit of priority under 35 U.S.C. § 120 as a continuation of PCT Patent Application No. PCT/CN2020/114980, filed on Sep. 14, 2020, which claims priority to Chinese Patent Application No. 201911071688.1, filed on Nov. 5, 2019, the disclosure of each of which is incorporated herein by reference in its entirety.

TECHNICAL FIELD

The present invention relates to the field of integrated circuits, and particularly to a detection circuit for detecting a state of an external capacitor of an integrated circuit.

BACKGROUND

FIG. 1 is a schematic structural view of an integrated circuit. Referring to FIG. 1, it shows three pins of an integrated circuit (IC) chip 110, which are a ground pin 111, an unfiltered source pin 113, and a filtered source pin 112. A resistor R is connected between the unfiltered source pin 113 and the filtered source pin 112, and the resistor R belongs to an internal circuit of the integrated circuit chip 110. A capacitor C is connected between the filtered source pin 112 and the ground pin 111. The capacitor C is an external capacitor and does not belong to the integrated circuit chip 110. On the one hand, the resistor R and the capacitor C can form a filter circuit to filter the signal of the unfiltered source pin 113 to obtain the signal of the filtered source pin 112; on the other hand, since the capacitor voltage drops slower than the power source voltage, the capacitor C can play the role of brownout protection when the voltage of the source pin is lowered, which provides a certain Brownout Margin for the power source voltage.

In some cases, the connection between the capacitor C and the pin of the integrated circuit chip 110 may be broken, or the parameter of the capacitor C may drift when the ambient temperature, humidity, electric field, etc has changed. In these cases, the ripple on the filtered source pin 112 will increase, thereby affecting the performance of the integrated circuit chip 110.

In the international standard ISO 26262 "Road Vehicles Functional Safety", automotive integrated circuits are usually required to have the function of diagnosing short or open pins. In order to measure the open state between the source pin and the external capacitor of the automotive integrated circuit chip, an AC (Alternating Current) current load can be added to the source pin and the AC ripple can be measured, but this method needs high currents and the resulting AC ripple can have a negative impact on the performance of the chip. Therefore, a more reliable and convenient method is needed to measure the open state between the chip pin and the external capacitor, as well as the parameter drift state of the external capacitor.

SUMMARY

The technical problem to be solved by the present invention is to provide a detection circuit and an integrated circuit which can conveniently detect a state of external capacitor.

To solve the above technical problem, the present invention provides a detection circuit for detecting a drift or an open circuit of a first capacitor on a filtered second power source terminal, the second power source terminal is suitable for acquiring a power source voltage from an unfiltered first power source terminal by means of a first resistor, and is suitable for being coupled to a reference electric potential terminal by means of the first capacitor so as to filter the power source voltage; the detection circuit comprises: a second resistor and a second capacitor that are connected in series and coupled between the first power source terminal and the reference electric potential terminal, wherein the second resistor and the second capacitor have a same time constant as the first resistor and the first capacitor; a simulated power source terminal connected between the second resistor and the second capacitor; and a comparator that is coupled to the second power source terminal and the simulated power source terminal and suitable for measuring a voltage difference between a filtered power source voltage of the second power source terminal and a simulated power source voltage of the simulated power source terminal, wherein the voltage difference indicates the degree of drift or the open circuit of the first capacitor.

Optionally, the detection circuit further comprises: a bleeder circuit that is coupled between the comparator and the second power source terminal to provide a divided voltage of the filtered power source voltage to the comparator; and a divider resistor that is coupled between the simulated power source terminal and the reference electric potential terminal, so that the simulated power source voltage is a divided voltage of an unfiltered power source voltage of the first power source terminal.

Optionally, the second resistor is a variable resistor.

Optionally, the second resistor is pre-adjusted such that the second resistor and the second capacitor have the same time constant as the first resistor and the first capacitor.

Optionally, the capacitance value of the second capacitor has a lower order of magnitude than the capacitance value of the first capacitor.

Optionally, the detection circuit is integrated in an integrated circuit, and the first power source terminal, the second power source terminal, and the reference electric potential terminal are terminals of the integrated circuit.

Optionally, the detection circuit further comprises a first switch for disconnecting the bleeder circuit, and a second switch for disconnecting the divider resistor.

To solve the above technical problem, the present invention further provides an integrated circuit, comprising of: an unfiltered first power source terminal; a filtered second power source terminal that is suitable for being coupled to the first power source terminal by means of a first resistor, and coupled to a reference electric potential terminal by means of a first capacitor; a second resistor and a second capacitor that are connected in series and coupled between the first power source terminal and the reference electric potential terminal, wherein the second resistor and the second capacitor have a same time constant as the first resistor and the first capacitor; a simulated power source terminal connected between the second resistor and the second capacitor; and a comparator that is coupled to the second power source terminal and the simulated power source terminal, and suitable for measuring a voltage difference between a filtered power source voltage of the second power source terminal and a simulated power source voltage of the simulated power source terminal.

Optionally, the integrated circuit further comprises: a bleeder circuit that is coupled between the comparator and the second power source terminal to provide a divided voltage of the filtered power source voltage to the comparator; and a divider resistor that is coupled between the simulated power source terminal and the reference electric potential terminal, so that the simulated power source voltage is a divided voltage of an unfiltered power source voltage of the first power source terminal.

Optionally, the second resistor is a variable resistor.

Optionally, the second resistor is pre-adjusted such that the second resistor and the second capacitor have a same time constant as the first resistor and the first capacitor.

Optionally, the capacitance value of the second capacitor has a lower order of magnitude than the capacitance value of the first capacitor.

Optionally, the integrated circuit further comprises: a first switch for disconnecting the bleeder circuit, and a second switch for disconnecting the divider resistor.

Optionally, the integrated circuit is an integrated circuit chip for a car.

Optionally, the integrated circuit is a battery controller.

The invention configures the internal RC circuit of the integrated circuit so that the time constant of the internal RC circuit is equal to the time constant of the external RC circuit including the external first capacitor C1, and the voltage of the internal capacitor and the external capacitor can be compared to detect a degree of drift or an open state of the capacitor C1. The detection circuit and the integrated circuit of the invention can realize the detection of the degree of drift or open circuit of the external capacitor C1 without adding additional external components, and has the advantages of easy integration and low cost.

BRIEF DESCRIPTION OF THE DRAWINGS

In order to make the above described objects, features, and advantages of the present invention become more apparent, embodiments of the present invention will be described in detail with reference to the accompanying drawings as follows.

DETAILED DESCRIPTION

Figure 1:
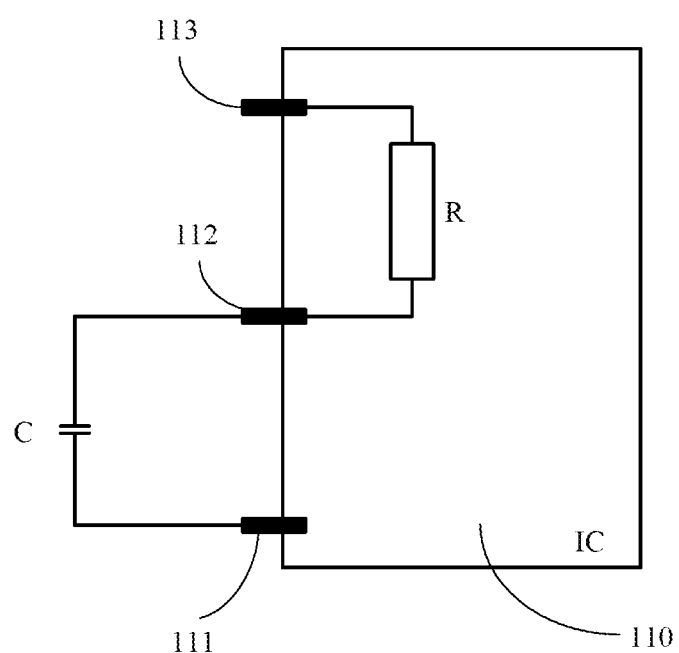
FIG. 1 is a schematic diagram of an integrated circuit.

In order to explain more clearly the technical scheme of the embodiment of this application, a brief introduction of the attached drawings required in the description of the embodiment is given below. Obviously, the drawings described below are only examples or embodiments of this application, from which the application can be applied to other similar situations without creative effort by ordinary technicians in the field. Unless obvious from the locale or otherwise indicated, the same labels in the diagram represent the same structure or operation.

As shown in this application and the claims, the words "a", "an", "a kind of" and/or "the" do not specifically refer to the singular, but may include the plural unless the context clearly indicates an exception. In general, the terms "including" and "comprising" are only meant to include clearly identified steps and elements, and these steps and elements do not constitute an exclusive list, and the method or device may also include other steps or elements.

The relative placement, numerical expressions and values of parts and steps described in these embodiments do not limit the scope of this application unless otherwise specified. At the same time, it should be understood that, for the sake of description, the dimensions of the parts shown in the attached drawings are not drawn to actual proportions. Techniques, methods and equipment known to ordinary technicians in the relevant field may not be discussed in detail, but where appropriate, said techniques, methods and equipment shall be considered as part of the license specification. In all the examples shown and discussed here, any specific values should be interpreted as exemplary only and not as a limitation. Therefore, other examples of exemplary embodiments can have different values. It should be noted that similar labels and letters indicate similar items in the appended drawings below, so once an item has been defined in one of the appended drawings, it does not need further discussion in subsequent appended drawings.

It should be understood that when a part is said to be "on another part", "connected to another part", "coupled to another part", or "in contact with another part", it may be directly on, connected to, coupled to, or in contact with the other part, or there may be inserted parts. In contrast, when a part is said to be "directly on another part", "directly connected to", "directly coupled to", or "directly in contact" with another part, there is no inserted part. Similarly, when the first part is called "electrical contact" or "electrically coupled" to the second part, there is an electrical path between the first part and the second part that allows the current to flow. The electrical path may include capacitors, coupled inductors, and/or other parts that allow current to flow, even without direct contact between conductive parts.

In addition, it should be noted that the use of "first", "second" and other words to define the parts is only for the convenience of distinguishing the corresponding parts. Unless otherwise stated, the above words have no special meaning and therefore cannot be understood as the limitation of the scope of protection applied for. In addition, although the terms used in this application have been selected from those in the public domain, some of the terms referred to in this application specification may have been chosen by the applicant in his or her judgment, and their full meanings are set out in the relevant sections of this description. In addition, the application is required to be understood not only by the actual terms used, but also by the meaning implied by each term.

Figure 2:
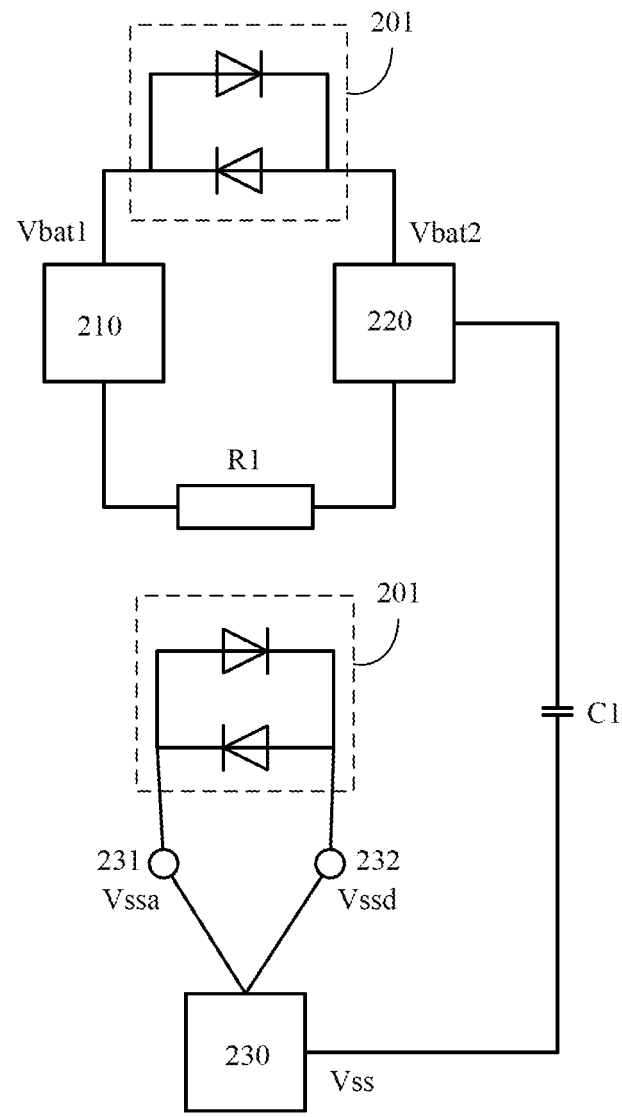
FIG. 2 is a schematic diagram of a circuit structure corresponding to a specific embodiment of the integrated circuit shown in FIG. 1.

FIG. 2 is a schematic diagram of a circuit structure corresponding to a specific embodiment of the integrated circuit shown in FIG. 1. Referring to FIG. 2, the circuit includes a first power source terminal 210, a second power source terminal 220, a first capacitor C1 and a first resistor R1, and a reference electric potential terminal 230. The two terminals of the first resistor R1 are respectively connected to the first power source terminal 210 and the second power source terminal 220. The two terminals of the first capacitor C1 are respectively connected to the second power source terminal 220 and the reference electric potential terminal 230. With reference to FIG. 1 and FIG. 2, the first power source terminal 210, the second power source terminal 220, and the first resistor R1 shown in FIG. 2 may be included inside the integrated circuit chip 110 shown in FIG. 1. The first power source terminal 210 is connected to the unfiltered source pin 113, the second power source terminal 220 is connected to the filtered source pin 112, and the reference electric potential terminal 230 is connected to the ground pin 111.

The resistor R in FIG. 1 corresponds to the first resistor R1 in FIG. 2, which is connected between the unfiltered source pin 113 and the filtered source pin 112 within the integrated circuit chip 110. The first capacitor C1 shown in FIG. 2 corresponds to the external capacitor C outside the integrated circuit chip 110 shown in FIG. 1. The first capacitor C1 is external to the integrated circuit chip 110 and is coupled between the filtered source pin 112 and the ground pin 111.

Generally, in order to reduce the cost and reduce the size of the circuit, the number of external electronic components of the integrated circuit will be minimized. Therefore, in the circuit structures shown in FIG. 1 and FIG. 2, the first resistor R1 is disposed inside the integrated circuit chip 110. In some embodiments, the first resistor R1 may also be disposed outside the integrated circuit chip 110, connected between the unfiltered source pin 113 and the filtered source pin 112, and form an RC circuit together with the first capacitor C1 which can function as a low pass filter.

Referring to FIG. 2, the first power source terminal 210 is normally coupled to a power source, which may be, for example, a battery. Therefore, the voltage detected on the first power source terminal 210 is the power source voltage, and is the unfiltered power source voltage Vbat1. The unfiltered power source voltage Vbat1 of the first power source terminal 210 is filtered by a filter circuit composed of a first resistor R1 inside the integrated circuit chip 110 and a first capacitor C1 outside the integrated circuit chip 110, and the second power source terminal 220 obtains the filtered power source voltage Vbat2.

Referring to FIG. 2, the reference potential Vss can be detected at the reference electric potential terminal 230. In the detection circuit, the reference electric potential terminal 230 may further include an analog reference electric potential terminal 231 and a digital reference electric potential terminal 232. Accordingly, the analog reference potential Vssa can be detected at the analog reference electric potential terminal 231, and the digital reference potential Vssd can be detected at the digital reference electric potential terminal 232.

In some embodiments, an ESD (Electro-Static Discharge) protection circuit 201 is formed between the first power source terminal 210 and the second power source terminal 220 by means of two mutually opposite diodes that are connected in parallel. The diode is called an ESD diode. When an electrostatic discharge occurs, the electrostatic spike voltage in the circuit can be clamped within the specified range by the ESD diodes in the ESD protection circuit 201, thereby protecting the stable operation of the chip. In some embodiments, an ESD protection circuit 201 is also coupled between the analog reference electric potential terminal 231 and the digital reference electric potential terminal 232, and also functions as an electrostatic discharge protection.

In the circuit shown in FIG. 2, an Internal Sensitive Circuit may also be included. The internal sensitive circuit (not shown) can be connected between the filtered second power source terminal 220 and the reference electric potential terminal 230. The function of the internal sensitive circuit is to reduce ripple interference on the second power source terminal 220 and to provide longer undervoltage protection period. Specifically, when an undervoltage occurs in the circuit, the internal sensitive circuit can make the voltage drop on the second power source terminal 220 more slowly than the voltage drop on the first power source terminal 210.

Generally, in order to measure the connection between the first capacitor C1 and the integrated circuit chip 110, that is, whether the first capacitor C1 is open or its parameter drifts, it is necessary to measure the current flowing through the first capacitor C1. However, according to the existing measurement technique, the current sensor for current measurement needs to be connected to the power source terminal, that is, the current sensor needs to be able to withstand a sufficiently high voltage. Moreover, it is difficult to obtain an accurate current value without affecting other components in the circuit.

Figure 3A:
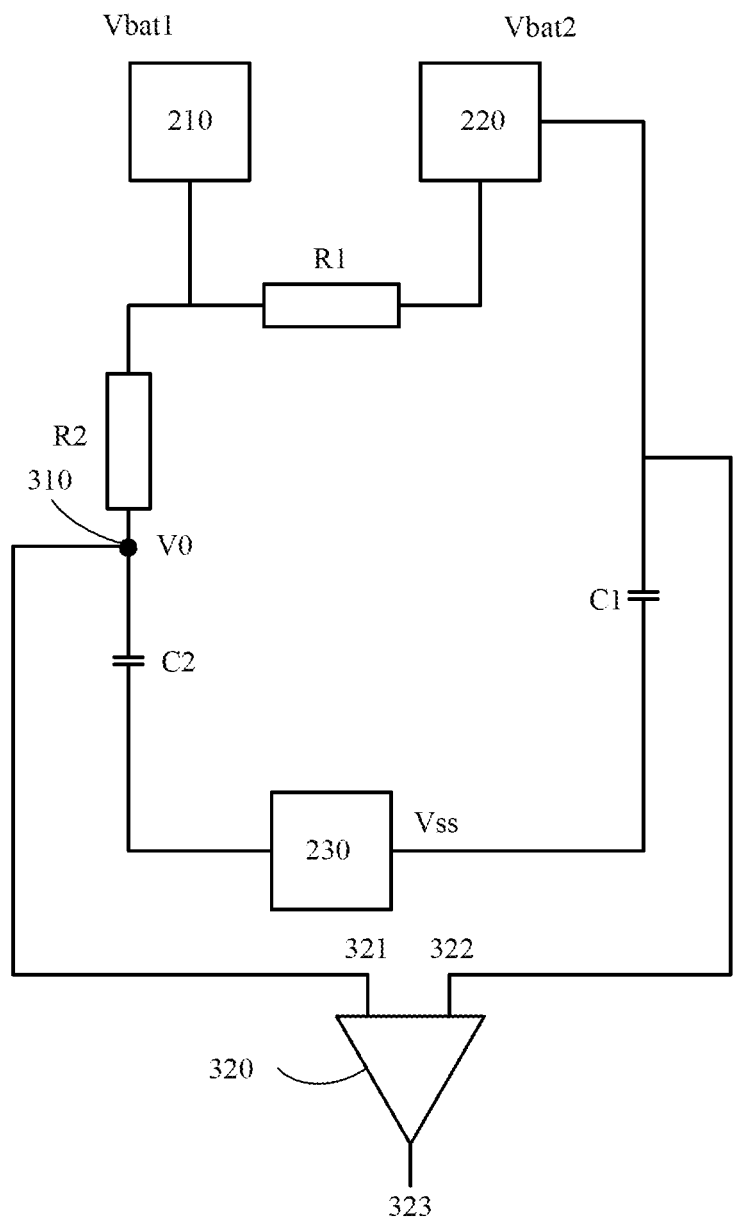
FIG. 3A is a circuit diagram of a detection circuit according to a first embodiment of the present invention.

FIG. 3A is a circuit diagram of a detection circuit in accordance with a first embodiment of the present invention. Referring to FIG. 3, the detection circuit includes the integrated circuit structure shown in FIG. 2, and further includes a second resistor R2, a second capacitor C2, a simulated power source terminal 310, and a comparator 320. For the ESD diodes in FIG. 2 are not necessary for the detection circuit, the ESD protection circuit 201 is not included in the embodiment shown in FIG. 3A. And the reference electric potential terminal 230 is shown as an independent terminal in FIG. 3A, which shows that the reference electric potential terminal 230 is not separated into an analog reference electric potential terminal 231 and a digital reference electric potential terminal 232.

In the embodiment shown in FIG. 3A, the second resistor R2 and the second capacitor C2 are connected in series with each other and coupled between the first power source terminal 210 and the reference electric potential terminal 230. As shown in FIG. 3A, one terminal of the second capacitor C2 is connected to one terminal of the second resistor R2, and the other terminal of the second capacitor C2 is connected to the reference electric potential terminal 230. The other terminal of the second resistor R2 is connected to the first resistor R1 while being connected to the first power source terminal 210.

Figure 3B:
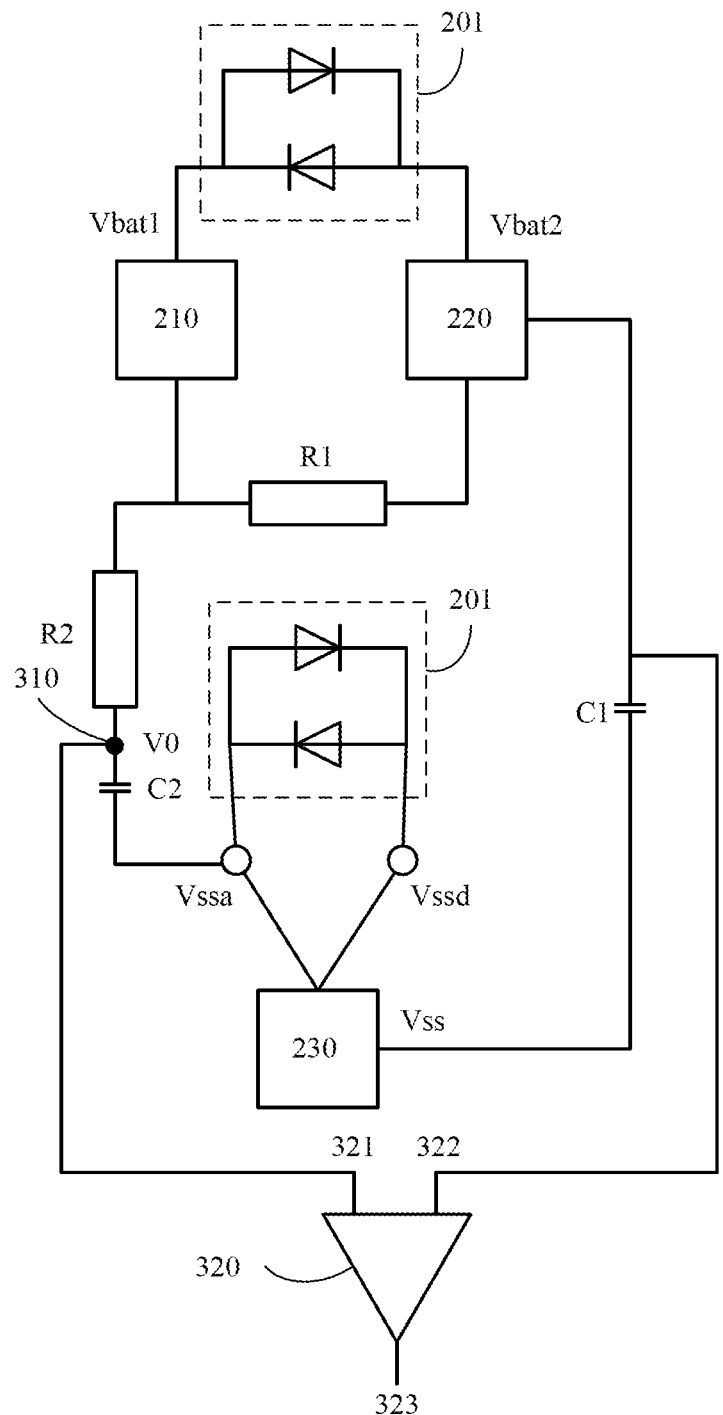
FIG. 3B is a circuit diagram of a detection circuit according to a second embodiment of the present invention.

FIG. 3B is a circuit diagram of a detection circuit according to a second embodiment of the present invention. Compared to the embodiment shown in FIG. 3A, the embodiment shown in FIG. 3B adds the ESD protection circuit 201 shown in FIG. 2, and separates the reference electric potential terminal 230 into an analog reference electric potential terminal 231 (Vssa) and a digital reference electric potential terminal 232 (Vssd). Wherein, one terminal of the second capacitor C2 is connected to one terminal of the second resistor R2, and the other terminal of the second capacitor C2 is connected to the analog reference electric potential terminal 231 (Vssa).

In some embodiments, the detection circuit is integrated in an integrated circuit, and the first power source terminal 210, the second power source terminal 220, and the reference electric potential terminal 230 are terminals of the integrated circuit. As shown in FIG. 1 to FIG. 3B, the detection circuit can be integrated in the integrated circuit chip 110, and the first power source terminal 210 corresponds to the unfiltered source pin 113, and the second power source terminal 220 corresponds to the filtered source pin 112, and the reference electric potential terminal 230 corresponds to the ground pin 111.

The first resistor R1 and the first capacitor C1 constitute a first RC circuit, and the second resistor R2 and the second capacitor C2 constitute a second RC circuit. In an embodiment of the invention, the first time constant τ1 of the first RC circuit and the second time constant τ2 of the second RC circuit are equal. For example, in a specific embodiment, R1=10 Ohm, C1=10 μF, R2=1 MOhm, C2=100 pF, then τ1=R1*C1=100 μs;

τ2=R2*C2=100 μs;

τ1=τ2.

The simulated power source terminal 310 is between the second resistor R2 and the second capacitor C2. The simulated power source terminal 310 is connected to an input terminal 321 of the comparator 320, and the voltage signal of the simulated power source terminal 310, that is, the simulated power source voltage V0, serves as an input to the comparator 320.

The two input terminals 321 and 322 of the comparator 320 are coupled to the simulated power source terminal 310 and the second power source terminal 220 respectively, and are suitable for measuring the filtered power source voltage Vbat2 of the second power source terminal 220 and the voltage difference V_diff of the simulated power source voltage V0 of the simulated power source terminal 310. The voltage difference V_diff can be used to indicate the degree of drift or open circuit of the first capacitor C1. That is, V_diff=|Vbat2−V0|

Wherein, | | indicates taking the absolute value.

Normally, the two inputs of the comparator 320 are analog voltage signals, and its output can be an analog voltage signal or a digital signal. The comparator 320 can compare the input voltages on the two input terminals 321 and 322, and perform a subtraction operation on the two input voltages to obtain a voltage difference V_diff. The output terminal 323 of the comparator 320 can directly output the voltage difference V_diff, or can set a detection threshold V_th for the comparator 320 as needed, and the comparator 320 determines the result of the output of the output terminal 323 according to the magnitude relationship between the voltage difference V_diff and the detection threshold V_th. For example, when the voltage difference V_diff is greater than the detection threshold V_th, the output terminal 323 of the comparator 320 outputs 1, and when the voltage difference V_diff is less than the detection threshold V_th, the output terminal 323 of the comparator 320 outputs 0. Therefore, the magnitudes of the two input voltages on the input terminals 321, 322 and their differences can be judged based on the output of the comparator 320.

In some embodiments, in conjunction with FIGS. 1 to 3B, the second resistor R2, the second capacitor C2, and the comparator 320 shown in FIGS. 3A and 3B are all inside the integrated circuit chip 110. In these embodiments, in the circuit structure shown in FIGS. 3A and 3B, all of the remaining electronic components except the first capacitor C1 belong to the internal circuit of the integrated circuit chip 110. The output terminal 323 of the comparator 320 may be connected to an external component through one of the pins of the integrated circuit chip 110, or it may be inside the integrated circuit chip 110.

In some parts in this specification, the first RC circuit composed of the first resistor R1 and the first capacitor C1 is referred to as an external RC circuit, and the second RC circuit composed of the second resistor R2 and the second capacitor C2 is referred to as an internal RC Circuit. Internal or external herein refers to being internal or external to the integrated circuit chip 110. It should be noted that the first resistor R1 in the external RC circuit may belong to the internal circuit of the integrated circuit chip 110.

In some embodiments, the capacitance value of the second capacitor C2 in the internal RC circuit has a lower order of magnitude than the capacitance value of the first capacitor C1 in the external RC circuit. This is because, on the one hand, the internal RC circuit does not need to transfer power, so a large capacitance value is not required; on the other hand, a capacitor with a small capacitance has a small volume, so that the size of the integrated circuit chip 110 can be reduced.

In the embodiment shown in FIGS. 3A and 3B, electronic components including capacitor, resistor, diode, comparator, and the like can employ electronic components commonly used in the art. Moreover, these electronic components are suitable for integration into an integrated circuit chip.

According to the embodiment shown in FIGS. 3A and 3B, when the first capacitor C1 is normally connected between the second power source terminal 220 and the reference electric potential terminal 230, since the time constant of the internal RC circuit formed inside the integrated circuit chip 110 is equal to the time constant of the external RC circuit, when the input voltages of the internal RC circuit and the external RC circuit are equal, the voltages on the second capacitor C2 and the first capacitor C1 should also be equal. Accordingly, Vbat2=V0, thereby making the input voltages on the two input terminals 321 and 322 of the comparator 320 are equal. Accordingly, the voltage difference V_diff is zero, thereby further affecting the output result of the output terminal 323 of the comparator 320. For example, for the comparator 320 whose output terminal 323 directly outputs the voltage difference V_diff, the output result of the output terminal 323 is also zero.

When the parameter of the first capacitor C1 drifts or the first capacitor opens, the voltage on the first capacitor C1 is not equal to the voltage on the second capacitor C2, and correspondingly, Vbat2≠V0, then V_diff≠0. For the comparator 320 whose detection threshold V_th can be configured, a detection threshold V_th can be configured as needed, and the voltage difference V_diff and the detection threshold V_th can be compared to determine the degree of drift or open circuit of the first capacitor C1. For example, a first detection threshold V_th1 is configured, if V_diff>V_th1, it is determined that the first capacitor C1 drifts, and the greater the difference between V_diff and V_th1, the more serious the degree of the drift. For example, a second detection threshold V_th2 is configured, and if V_diff>V_th2, it is determined that the first capacitor C1 is open.

Therefore, based on the output result of the comparator 320, it can be determined whether the first capacitor C1 is open or drifted, and the degree of drift, etc.

The technical effect of the first and second embodiments shown in FIGS. 3A and 3B are that it is not necessary to measure the current of the first capacitor C1 directly, but through the internal RC circuit which is formed inside the integrated circuit chip 110 and making the internal RC circuit to have a same time constant as the external RC circuit including the first capacitor C1. By comparing the voltage of the second capacitor C2 in the internal RC circuit with the voltage of the first capacitor C1 in the external RC circuit, it is possible to judge the degree of drift or open circuit of the first capacitor C1.

In a practical application, the first power source terminal 210 and the second power source terminal 220 are connected to a power source, and the voltage applied to the first capacitor C1 is equal to the power source voltage accordingly, which means that the voltage on the second capacitor C2 inside the integrated circuit chip 110 is also equal to the power source voltage. Therefore, for the first and second embodiments shown in FIGS. 3A and 3B, on the one hand, if the power source voltage is greater than the maximum operating voltage of the total integrated capacitor in the integrated circuit, the second capacitor C2 needs to have a high rated voltage; on the other hand, the volume of the capacitor with a high rated voltage is large, which increases the volume of the integrated circuit chip 110. According to this problem, the present invention further proposes the embodiment shown in FIG. 4.

Figure 4:
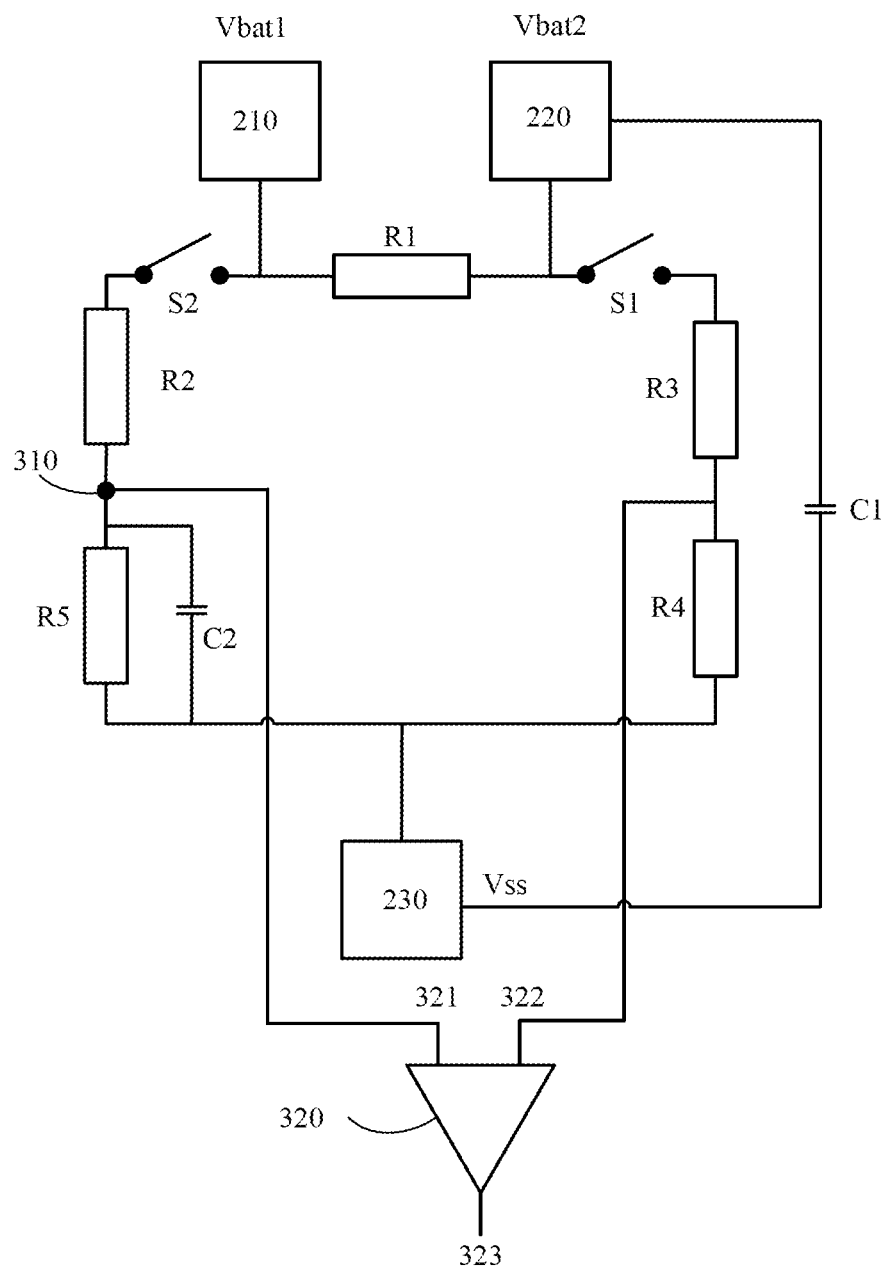
FIG. 4 is a circuit diagram of a detection circuit according to a third embodiment of the present invention.

FIG. 4 is a circuit diagram of a detection circuit according to a third embodiment of the present invention. The third embodiment shown in FIG. 4 adds a bleeder circuit and a divider resistor to the structure of the detecting circuit shown in FIG. 3B. The bleeder circuit is coupled between the comparator 320 and the second power source terminal 220 to provide a divided voltage of the filtered power source voltage Vbat2 to the comparator 320; the divider resistor is coupled between the simulated power source terminal 310 and the reference electric potential terminal 230, in order to make the simulated power source voltage V0 to be a divided voltage of the unfiltered power source voltage Vbat1 of the first power source terminal 210. Specifically, referring to FIG. 4, the bleeder circuit includes a third resistor R3 and a fourth resistor R4. The third resistor R3 and the fourth resistor R4 are connected in series with each other and are connected together between the second power source terminal 220 and the reference electric potential terminal 230. One terminal of the third resistor R3 is connected to the second power source terminal 220, and the other terminal of the third resistor R3 is connected to one terminal of the fourth resistor R4 and one input terminal 322 of the comparator 320; one terminal of the fourth resistor R4 is connected to one terminal of the third resistor R3 and one input terminal 322 of the comparator 320, and the other terminal of the fourth resistor R4 is connected to the reference electric potential terminal 230. Referring to FIG. 4, the divider resistor includes a fifth resistor R5, one terminal of which is connected to one terminal of the second resistor R2 and the simulated power source terminal 310, and the other terminal of which is connected to the reference electric potential terminal 230. Further, one terminal of the fifth resistor R5 is connected to one input terminal 321 of the comparator 320 through the simulated power source terminal 310.

It can be understood that, according to the embodiment shown in FIG. 4, the voltages input to the two input terminals 321, 322 of the comparator 320 are respectively divided by the bleeder circuit and the divider resistor. Wherein, the bleeder circuit (the third resistor R3 and the fourth resistor R4) divides the voltage on the first capacitor C1, which can lower the voltage on the first capacitor C1; and the divider resistor (the fifth resistor R5) divides the voltage on the second capacitor C2, which can lower the voltage on the second capacitor C2. The invention does not limit the degree of how much the voltage can be divided by the bleeder circuit and the divider resistor, and the specific resistance value and the capacitance value can be configured to control the divided voltage to be obtained.

In these embodiments, the first RC circuit (external RC circuit) includes a first capacitor C1, a first resistor R1, a third resistor R3, and a fourth resistor R4; and the second RC circuit (internal RC circuit) includes a second capacitor C2, the second resistor R2, and the fifth resistor R5. By setting the specific values of the respective electronic components in the first RC circuit and the second RC circuit by the result of theoretical calculation, the time constant of the second RC circuit can be made equal to the time constant of the first RC circuit.

For example, in one embodiment, R1=10 Ohm, C1=10 μF, R2=1 MOhm, C2=100 pF without adding the bleeder circuit and the divider resistor. After adding the bleeder circuit and the divider resistor, set R3=1 MOhm, R4=1 MOhm, R5=1 MOhm, and adjust C2=200 pF. According to these settings, the time constant of the first RC circuit can be made equal to the time constant of the second RC circuit, and the voltages input to the two input terminals 321, 322 of the comparator 320 can be reduced by half.

According to the embodiment shown in FIG. 4, not only the voltages to be withstood by the first capacitor C1 and the second capacitor C2 can be reduced, but also the bleeder circuit and the divider resistor provide a second ESD protection for the circuit, so that a low input voltage transistor can be used at the input terminal of the comparator 320. In order to avoid leakage current caused by the bleeder circuit and the divider resistor, the resistance value is set relatively high, for example, the MOhm level resistor is used.

In some embodiments, the detection circuit of the present invention further includes a first switch S1 for disconnecting the bleeder circuit and a second switch S2 for disconnecting the divider resistor. The first switch S1 can be connected in series with the bleeder circuit, and the second switch S2 can be connected in series with the divider resistor. In these embodiments, when the detection circuit is required, the first switch S1 and the second switch S2 can be kept close, and when the bleeder circuit and the divider resistor are not required, the first switch S1 and the second switch S2 are opened, thereby cutting off the connection between the bleeder circuit and the divider resistor and other circuits in order to prevent leakage current.

The resistance and capacitance inside an integrated circuit typically have an error or tolerance of about ±30%, and the capacitance external to an integrated circuit has an error or tolerance of about ±50%. In other words, there is a certain error between the actual resistance and capacitance values of the resistors and capacitors and their nominal resistance and capacitance values. Therefore, in order for the time constant of the internal RC circuit to be substantially equal to the time constant of the external RC circuit, it is necessary to adjust the resistance and/or the capacitance therein. In some embodiments, variable capacitance and/or variable resistance may be employed in the internal RC circuit. However, since the variable capacitance is bulky, a variable resistor is used in embodiments of the present invention.

For the embodiments of the detection circuit shown in FIGS. 3A, 3B and 4, the second resistor R2 therein may employ a variable resistor. In these embodiments, the second resistor R2 may be pre-adjusted such that the second resistor R2 and the second capacitor C2 have the same time constant as the first resistor R1 and the first capacitor C1. Specifically, the time T1 and T2 taken by the voltage Vc1 on the first capacitor C1 and the voltage Vc2 on the second capacitor C2 to reach a preset voltage may be measured; and if the voltage Vc2 of the second capacitor C2 reaches the preset voltage faster than the voltage Vc1 of the first capacitor C1, that is, T2<T1, it indicates that the time constant of the internal RC circuit is smaller than the time constant of the external RC circuit. And the value of the second resistor R2 can be adjusted according to the relationship between T1 and T2 to make the time constant of the internal RC circuit equal to the time constant of the external RC circuit. It can be understood that the method for adjusting the time constant here is only for the example, and other methods can be used to adjust the value of the second resistor R2 so that the time constant of the internal RC circuit is equal to the time constant of the external RC circuit.

In some embodiments, the fifth resistor R5 and/or the second resistor R2 in the internal RC circuit shown in FIG. 4 can be variable resistor.

Figure 5:
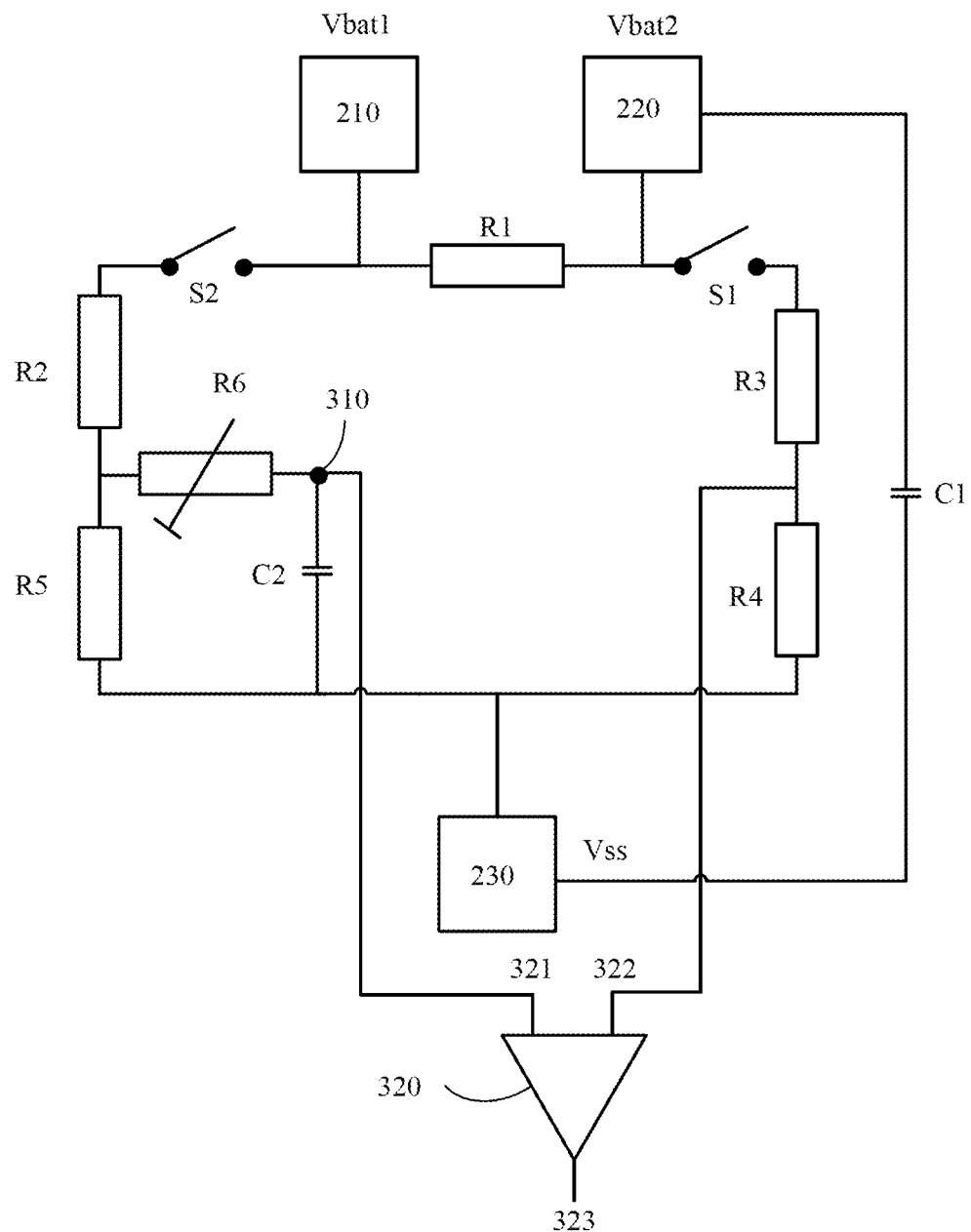
FIG. 5 is a circuit diagram of a detection circuit according to a fourth embodiment of the present invention.

FIG. 5 is a circuit diagram of a detection circuit in accordance with a fourth embodiment of the present invention. Compared to the embodiment shown in FIG. 4, the embodiment shown in FIG. 5 adds a sixth resistor R6 to the internal RC circuit. One terminal of the sixth resistor R6 is simultaneously connected to one terminal of the second resistor R2 and one terminal of the fifth resistor R5, and the other terminal of the sixth resistor R6 is connected to one terminal of the second capacitor C2 and the simulated power source terminal 310. In this embodiment, the second resistor R2, the fifth resistor R5, the sixth resistor R6, and the second capacitor C2 together constitute an internal RC circuit. Therefore, each resistance value and capacitance value should be set such that the time constant of the internal RC circuit is equal to the time constant of the external RC circuit.

In some embodiments, the sixth resistor R6 can be a variable resistor. For example, when R1=10 Ohm, C1=10 µF, R3=1 MOhm, R4=1 MOhm, C2=100 pF, set R2=700 kOhm, R5=700 kOhm, and R6=0~300 kOhm. The resistance value of the sixth resistor R6 can be adjusted between 0 and 300 kOhm. The embodiment shown in FIG. 5 can also be used in the case where the actual capacitance value and the nominal value of the first capacitor C1 and/or the second capacitor C2 are not equal, and the resistance of the sixth resistor R6 is adjusted according to the adjustment method described above, making the time constant of the internal RC circuit to be substantially equal to the time constant of the external RC circuit.

It can be understood that, similar to the embodiment shown in FIG. 3B, in other embodiments, the ESD protection circuit 201 can be added into the embodiments shown in FIGS. 4 and 5, and the reference electric potential terminal 230 can be separated into an analog reference electric potential terminal 231 and a digital reference electric potential terminal 232, and the terminal of the second capacitor C2 which is connected to the reference electric potential terminal 230 can be connected to the analog reference electric potential terminal 231 of the reference electric potential terminal 230.

In the embodiments of the detection circuit shown from FIGS. 3A to 5, a detection threshold V_th may be set for the comparator 320, and the comparator 320 will compare the voltage difference V_diff of the voltages input to its two input terminals 321, 322 with the detection threshold V_th to determine the degree of drift or open circuit of the first capacitor C1. The detection threshold V_th can be set by a person skilled in the art as needed. A method for determining the detection threshold V_th will be described below by taking an integrated circuit for automobile battery management as an example.

For an integrated circuit for automotive battery management, including all of the electronic components in the detection circuit described above, the detection circuit can detect the degree of drift or open circuit of the first capacitor externally connected to the integrated circuit. It can be understood that the integrated circuit can also be applied to other fields other than automotive which require battery management.

Figure 6:
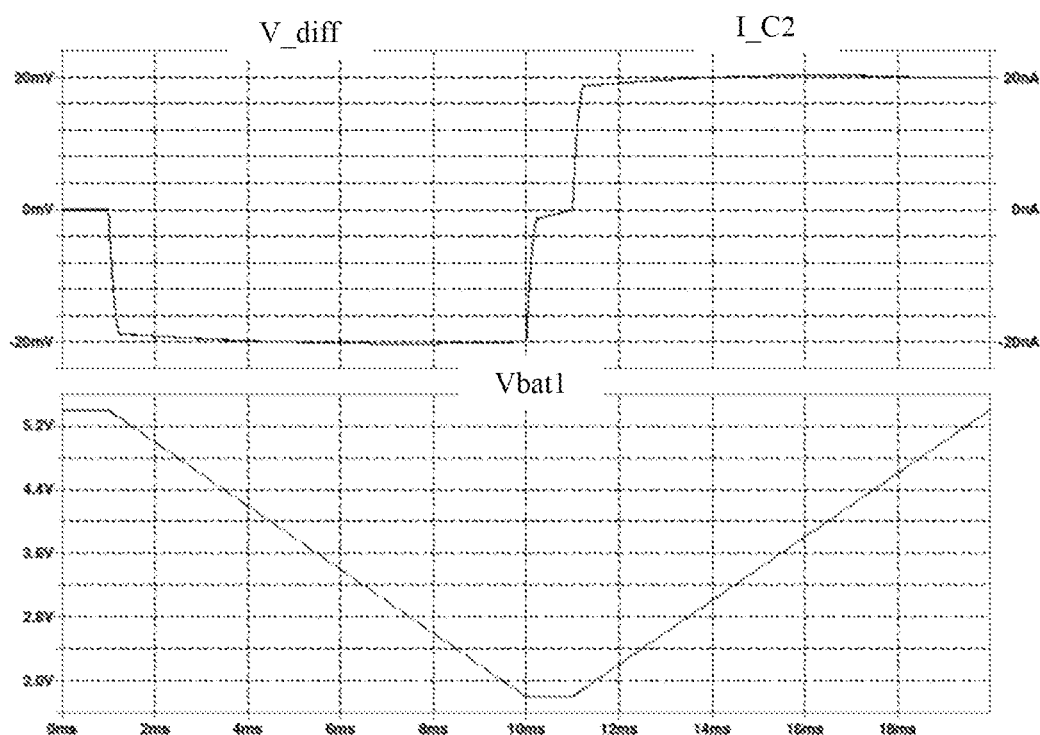
FIG. 6 is a schematic diagram showing changes in battery voltage of the detection circuit, and changes in voltage and current of an internal RC circuit and an external RC circuit, when the first capacitor C1 is open, according to an embodiment of the present invention.

FIG. 6 is a schematic diagram showing changes in battery voltage and changes in voltages and currents of an internal RC circuit and an external RC circuit when the first capacitor is open in the detection circuit according to an embodiment of the invention. It should be noted that the voltage current shown in FIG. 6 is based on the detection circuit of the embodiment shown in FIG. 4. Referring to FIG. 6, the horizontal axis represents time, and the unit is ms; the left vertical axis is voltage, and the unit is mV or V; the right vertical axis is current, and the unit is nA. FIG. 6 mainly includes upper and lower parts. The upper part shows the voltage difference V_diff on the two input terminals 321, 322 of the comparator 320, and the current I_C2 on the second capacitor C2 as a function of time; the lower part shows the car battery voltage as a function of time.

For an automotive battery, the supply voltage supplied to the automotive battery changes with a certain slope as the driving current increases. Assuming that the supply voltage is V, the rate of change dV/dt of the voltage is a constant as the driving current increases. The rate of change dV/dt is 0.4 V/ms under normal conditions and 5 V/ms in extreme cases. Referring to FIG. 4, normally, the supply voltage V is supplied to the detection circuit through the first power source terminal 210, that is, Vbat1=V, and accordingly, dVbat1/dt=dV/dt. According to the lower part of FIG. 6, by measuring the unfiltered power source voltage Vbat1 of the first power source terminal 210, a curve of Vbat1 as a function of time is obtained. The unfiltered power source voltage Vbat1 first drops at a rate of 0.4V/ms, from about 5.4V at 0ms to about 1.7V, and then rises at a rate of 0.4V/ms. Vbat1 rises to the original voltage of 5.4V at approximately 20 ms.

In FIG. 6, the upper part and the lower part share the same horizontal axis. Therefore, in the process in which the unfiltered power source voltage Vbat1 falls, the voltage difference V_diff obtained by the comparator 320 is about −20 mV, and the absolute value of the voltage difference V_diff is 20 mV. Since the result shown in FIG. 6 is in the state where the first capacitor C1 is open, in order to measure the degree of drift or open circuit of the first capacitor C1, it is necessary to set V_th<20 mV, where V_th represents the detection threshold of the comparator 320. When there is an error of 30% in the capacitance value of the first capacitor C1 and/or the second capacitor C2, the difference between the measured voltage difference V_diff and the actual voltage difference is about 6 mV. In this case, the degree of drift or open circuit of the first capacitor C1 can still be detected by setting an appropriate detection threshold V_th. In some embodiments, comparator 320 is an auto-zero comparator.

The upper part of FIG. 6 also shows a plot of current I_C2 on the second capacitor C2 as a function of time. In the process in which the unfiltered power source voltage Vbat1 rises at a rate of 0.4 V/ms from about 11 ms, the current I_C2 is substantially maintained at about 20 nA.

In some embodiments, the detection threshold V_th can be determined by analyzing the ripple of the battery voltage. For an integrated circuit of an automotive battery management, the frequency of the ripple interference is related to the traveling speed of the car due to the high-frequency ripple interference caused by the inverse conversion flow. Most of the harmonics in this ripple are between 1.6 kHz and 15 kHz. For each battery cell, the peak-to-peak value of the ripple can reach 0.5 Vpp.

Figure 7:
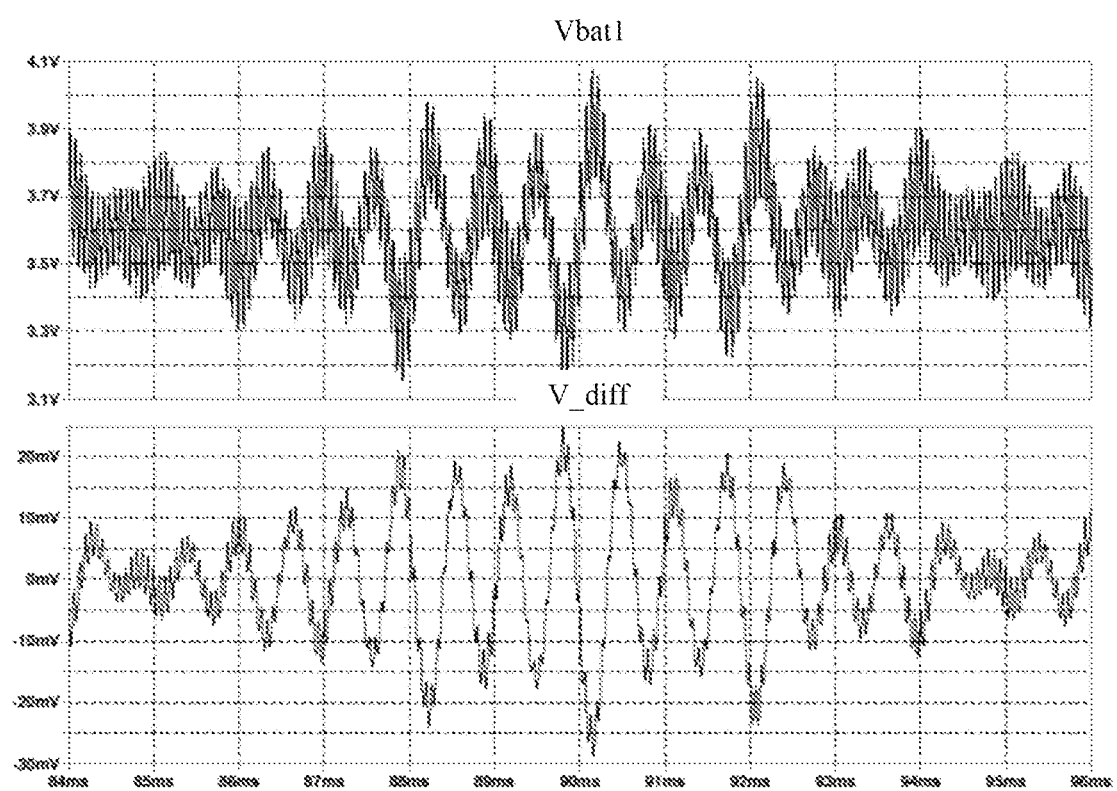
FIG. 7 is a schematic diagram showing changes in battery voltage ripple and voltage difference of the detection circuit, when the first capacitor C1 is 70% drifted, according to an embodiment of the invention.

FIG. 7 is a schematic diagram showing changes in battery voltage ripple and voltage difference of the detection circuit when the first capacitor C1 is 70% drifted according to an embodiment of the invention. What FIG. 7 shows is also based on the embodiment of the detection circuit shown in FIG. 4. Referring to FIG. 7, the horizontal axis represents time and the unit is ms; the left vertical axis is voltage, and the unit is mV or V. FIG. 7 mainly includes upper and lower parts, the upper part shows a function of time of the car battery voltage Vbat1; the lower part shows the voltage difference V_diff on the two input terminals 321, 322 of the comparator 320 as a function of time when the actual value of the first capacitor C1 is 70% of the nominal value. As can be seen from the upper part of FIG. 7, the battery cell voltage has a significant ripple due to the inverse conversion flow.

Referring to FIG. 7, the voltage difference V_diff can be up to about 20 mV. Therefore, a detection threshold V_th=10 mV can be set. Thus, when the voltage difference V_diff>V_th is detected, it can be said that the first capacitor C1 has drifted. When the first capacitor C1 is completely turned off or open circuit, in the case shown in FIG. 7, the voltage difference V_diff can be up to 160 mV.

According to FIG. 7, by setting a reasonable detection threshold V_th, 10 mV for example, the degree of drift or open circuit of the first capacitor C1 can be detected by the ripple generated by the vehicle inverse conversion, and an additional current generator is not required. Generally, when the car is driving, braking or charging, a more obvious ripple is generated in the car battery voltage Vbat1. When the car is stopped or operated at low load, the ripple amplitude in the car battery voltage Vbat1 is low, and the voltage difference V_diff is too small to be detected, but in this case, the impact of the drift or open circuit of the first capacitor C1 is also small to the accurate control of circuit and therefore is negligible.

The detection circuit of the invention can realize the detection of the degree of drift or open circuit of the external capacitor C1 externally connected to the integrated circuit without adding additional external components, and has the beneficial effects of easy integration and low cost.

Figure 8A:
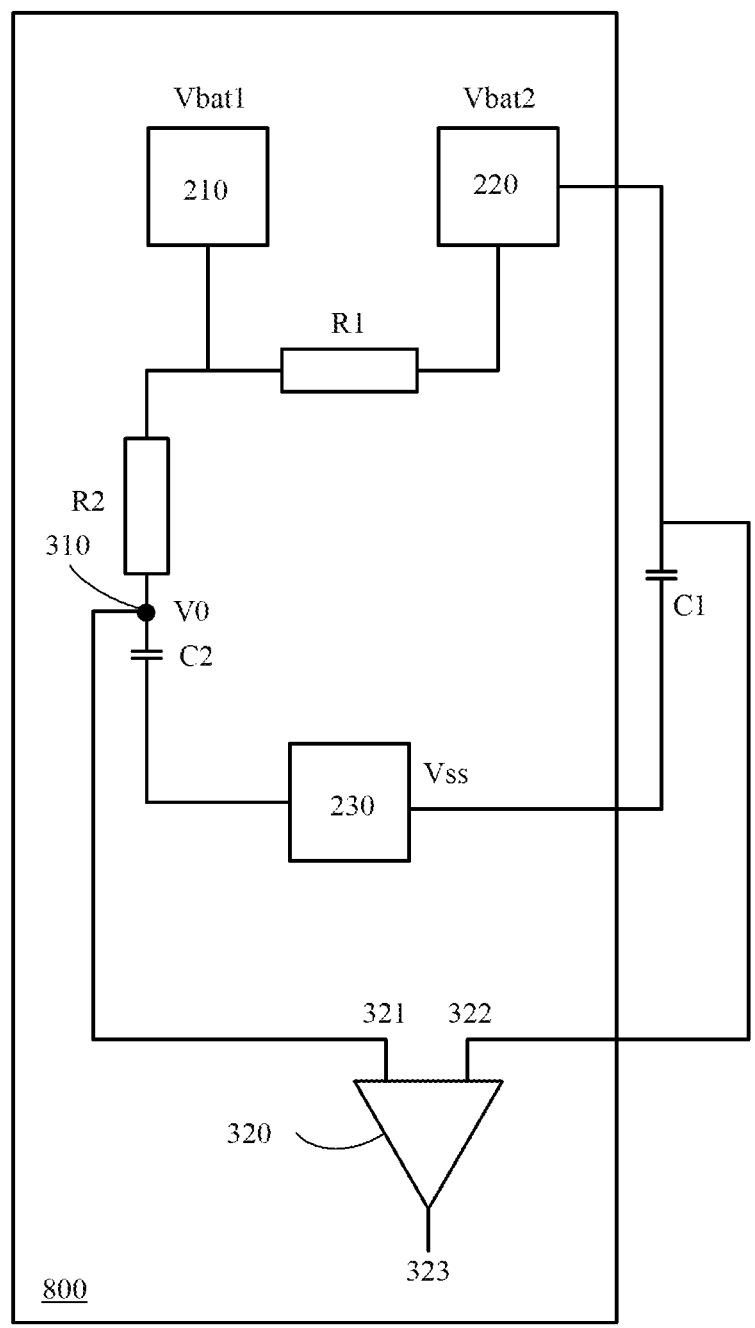
FIG. 8A is a circuit diagram of an integrated circuit according to a first embodiment of the present invention.

FIG. 8A is a schematic structural diagram of an integrated circuit according to a first embodiment of the present invention. Referring to FIG. 8A, the integrated circuit 800 includes an unfiltered first power source terminal 210; a filtered second power source terminal 220 that is suitable for being coupled to the first power source terminal 210 by means of the first resistor R1, and coupled to a reference electric potential terminal 230 by means of a first capacitor C1; a second resistor R2 and a second capacitor C2 that are connected in series and coupled between the first power source terminal 210 and the reference electric potential terminal 230, wherein the second resistor R2 and the second capacitor C2 have a same time constant as the first resistor R1 and the first capacitor C1; a simulated power source terminal 310 is connected between the second resistor R2 and the second capacitor C2; a comparator 320 that is coupled to the second power source terminal 320 and the simulated power source terminal 310, and suitable for measuring the voltage difference between a filtered power source voltage Vbat2 of the power source terminal 220 and a simulated power source voltage V0 of the simulated power source terminal 310.

It should be noted that, in the embodiment shown in FIG. 8A, the first capacitor C1 is externally connected to the integrated circuit 800. The first RC circuit composed of the first resistor R1 and the first capacitor C1 is referred to as an external RC circuit, and the second RC circuit composed of the second resistor R2 and the second capacitor C2 is referred to as an internal RC circuit.

Referring to FIGS. 3A and 8A, the integrated circuit 800 shown in FIG. 8A includes the detection circuit shown in FIG. 3A. Therefore, the description of the detection circuit shown in FIG. 3A in this specification is applicable to the integration circuit shown in FIG. 8A.

Figure 8B:
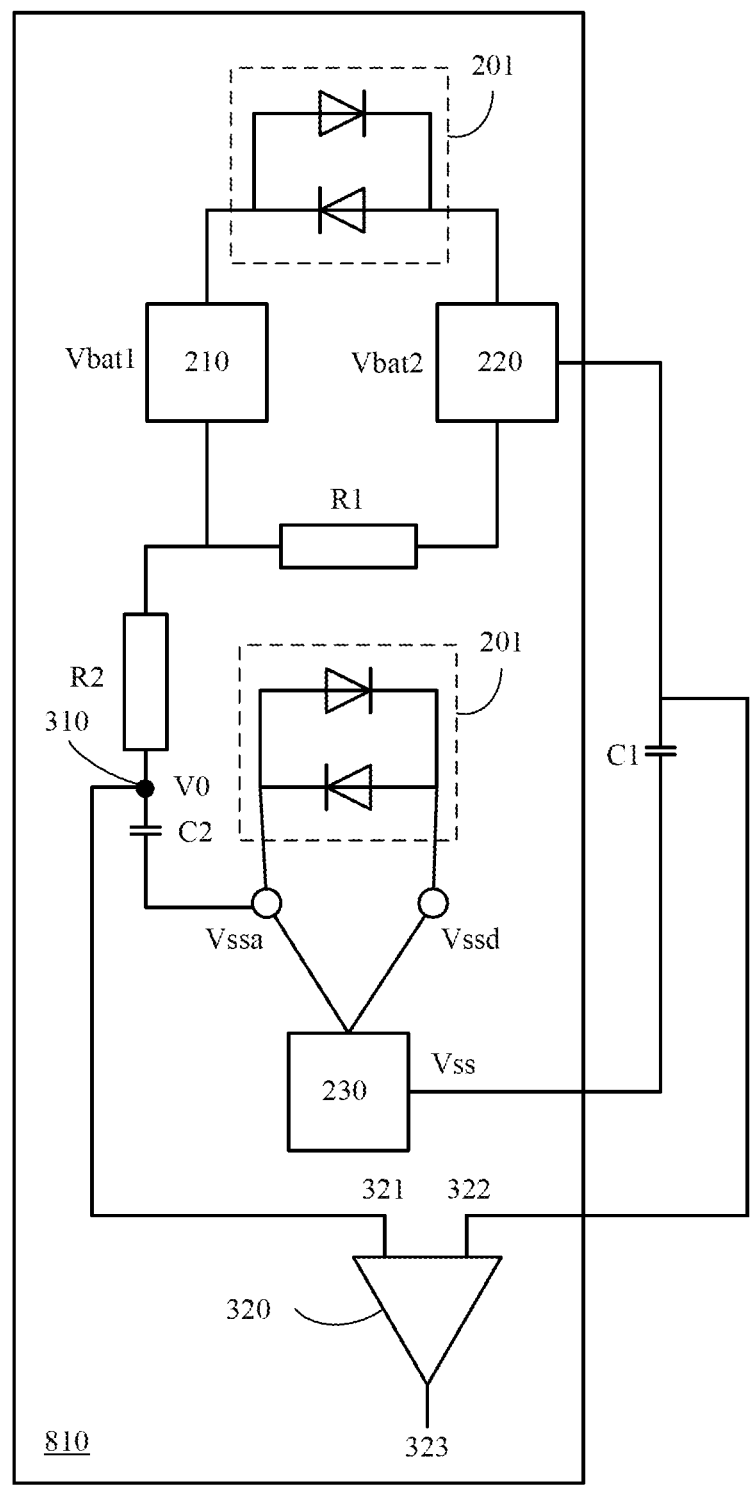
FIG. 8B is a circuit diagram of an integrated circuit according to a second embodiment of the present invention.

FIG. 8B is a schematic structural diagram of an integrated circuit according to a second embodiment of the present invention. Compared to the embodiment shown in FIG. 8A, the embodiment shown in FIG. 8B adds the ESD protection circuit 201 shown in FIG. 2, and separates the reference electric potential terminal 230 into an analog reference electric potential terminal 231 and a digital reference electric potential terminal 232. Wherein, one terminal of the second capacitor C2 is connected to one terminal of the second resistor R2, and the other terminal of the second capacitor C2 is connected to the analog reference electric potential terminal 231.

Referring to FIGS. 3B and 8B, the integrated circuit 810 shown in FIG. 8B includes the detection circuit shown in FIG. 3B. Therefore, the description of the detection circuit shown in FIG. 3B in this specification is applicable to the integration circuit shown in FIG. 8B.

Figure 8C:
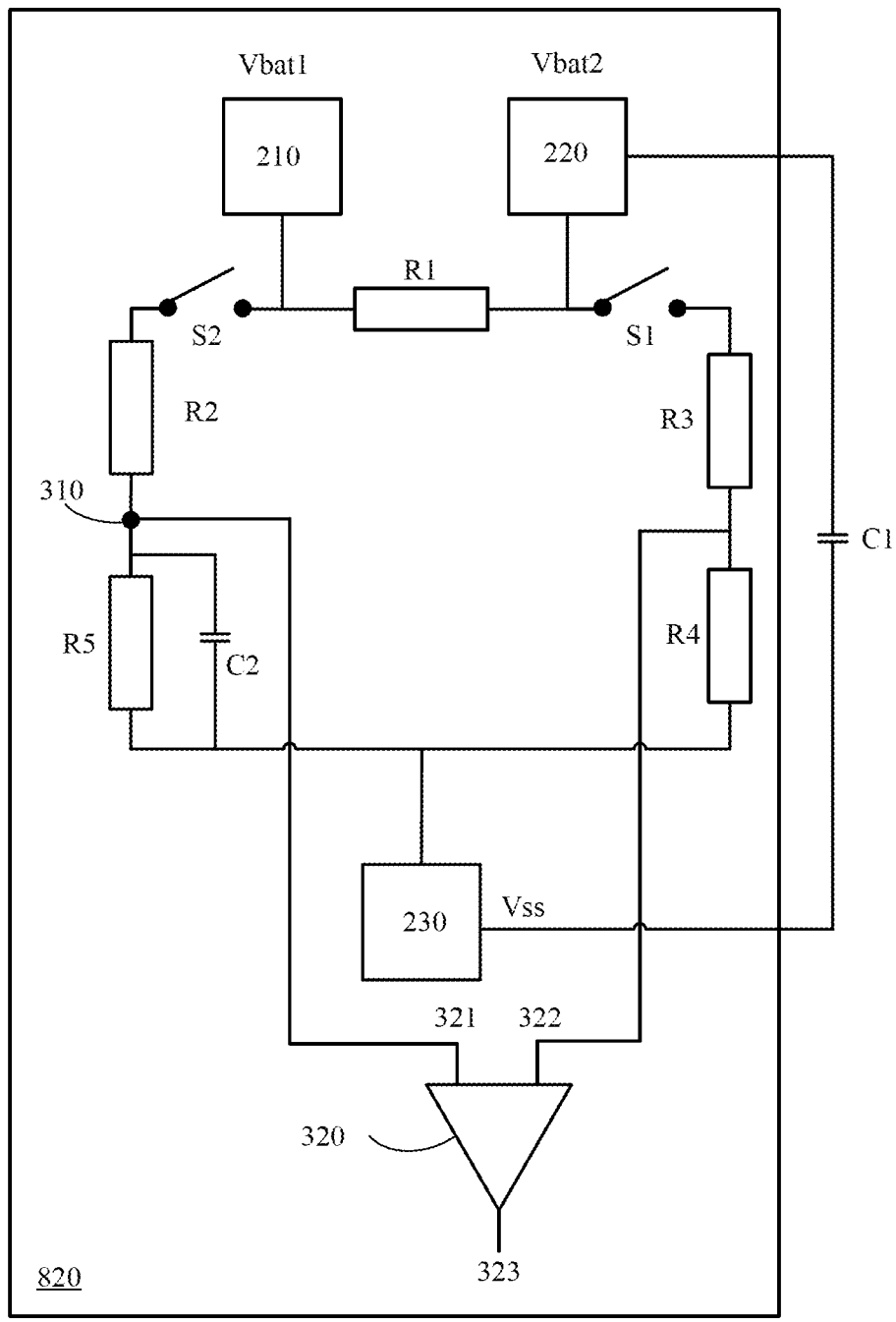
FIG. 8C is a circuit diagram of an integrated circuit according to a third embodiment of the present invention.

FIG. 8C is a schematic structural diagram of an integrated circuit according to a third embodiment of the present invention. Referring to FIG. 8C, the integrated circuit 820 of this embodiment adds a bleeder circuit and a divider resistor to the embodiment shown in FIG. 8A. The bleeder circuit is coupled between the comparator 320 and the second power source terminal 220 to provide a divided voltage of the filtered power source voltage Vbat2 to the comparator 320; and a divider resistor coupled between the simulated power source terminal 310 and the reference electric potential terminal 230 in order to make the simulated power source voltage V0 to be a divided voltage of the unfiltered power source voltage Vbat1 of the first power source terminal 210. Referring to FIG. 4 and FIG. 8C, the integrated circuit 820 shown in FIG. 8C includes the detection circuit shown in FIG. 4, and therefore the description of the detection circuit shown in FIG. 4 is applicable to the integrated circuit shown in FIG. 8C.

In some embodiments, the second resistor R2 in FIGS. 8A-8C is a variable resistor. In these embodiments, the second resistor R2 is pre-adjusted such that the second resistor R2 and the second capacitor C2 have the same time constant as the first resistor R1 and the first capacitor C1.

In some embodiments, the capacitance value of the second capacitor C2 has a lower order of magnitude than the capacitance value of the first capacitor C1.

In the embodiment shown in FIG. 8C, a first switch S1 for disconnecting the bleeder circuit and a second switch S2 for disconnecting the divider resistor are further included.

Figure 8D:
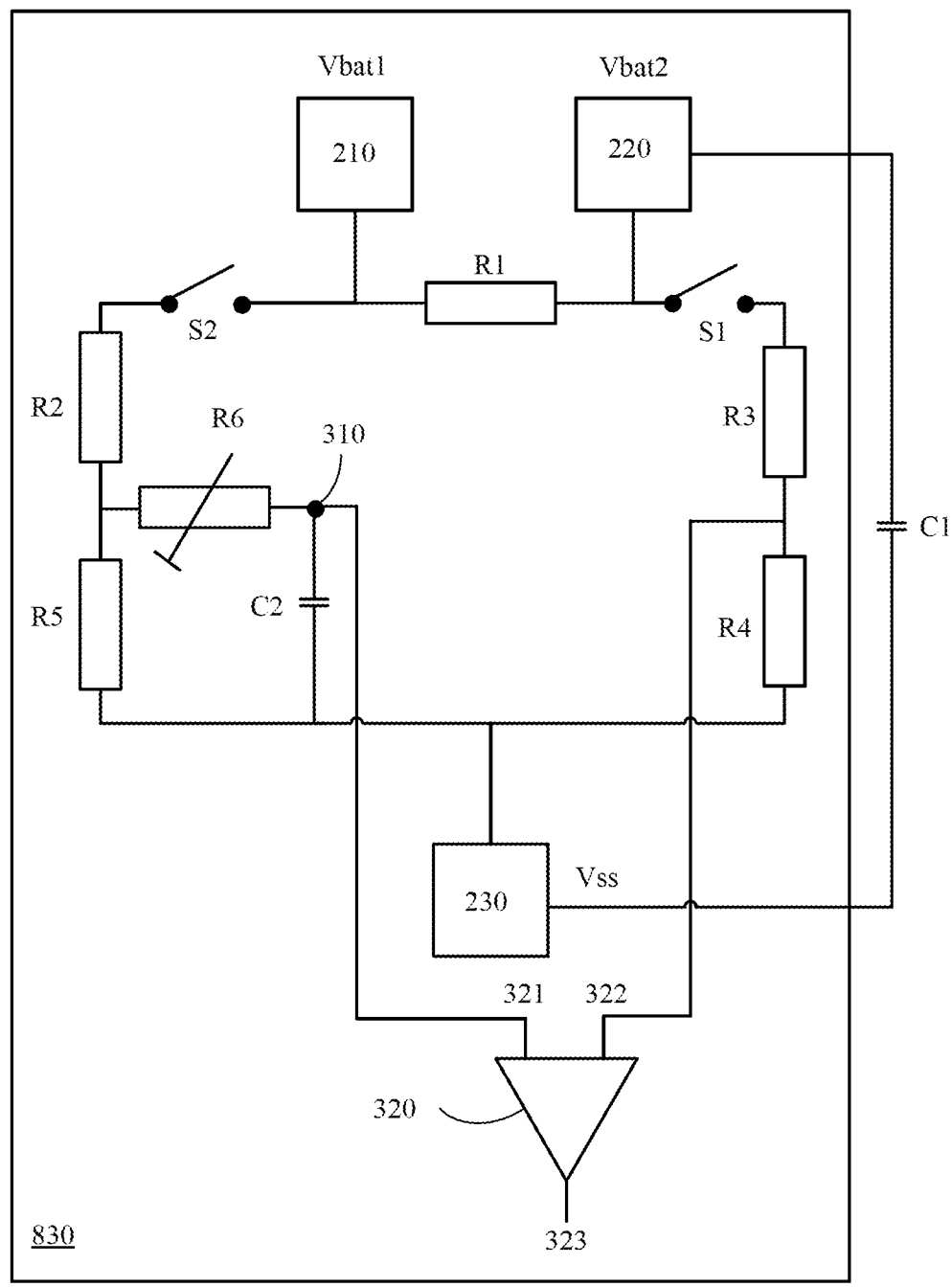
FIG. 8D is a circuit diagram of an integrated circuit according to a fourth embodiment of the present invention.

FIG. 8D is a schematic structural diagram of an integrated circuit according to a fourth embodiment of the present invention. Compared to the embodiment shown in FIG. 8C, a sixth resistor R6 is added into the internal RC circuit in the embodiment shown in FIG. 8D. Referring to FIGS. 5 and 8D, the integrated circuit 830 shown in FIG. 8D includes the detection circuit shown in FIG. 5, and therefore the description of the detection circuit shown in FIG. 5 is applicable to the integrated circuit shown in FIG. 8D.

It can be understood that, the embodiments of integrated circuit shown in FIGS. 8A-8D are corresponding to the embodiments of detection circuit shown in FIGS. 3A-5. In other embodiments, the ESD protection circuit 201 can be added into FIGS. 8C and 8D, and the reference electric potential terminal 230 can be separated into an analog reference electric potential terminal 231 and a digital reference electric potential terminal 232, and the terminal of the second capacitor C2 which is connected to the reference electric potential terminal 230 can be connected to the analog reference electric potential terminal 231.

In some embodiments, the integrated circuit shown in FIGS. 8A-8D is a battery controller.

According to the integrated circuit shown in FIGS. 8A-8D, the degree of drift or open circuit of the external capacitor C1 can be detected. Specifically, how to set the detection threshold V_th for the comparator 320 and how to use the obtained voltage difference V_diff to determine the state of the first capacitor C1 can refer to the description of the detection circuit and the corresponding drawings in the foregoing specification.

It can be understood that the detection circuit and the integrated circuit of the present invention can be used for any circuit requiring functional safety protection, and can detect the degree of drift or open circuit of the external capacitor of the integrated circuit, and is not limited to the automobile battery management integrated circuit in the specific embodiment of the present invention.

Although the invention has been described with reference to the current specific embodiments, ordinary technical personnel in the technical field should realize that the above embodiments are only used to illustrate the invention, and various equivalent changes or substitutions can be made without deviating from the spirit of the invention. Therefore, any variation or alteration of the above embodiments within the essential spirit of the invention shall fall within the scope of the claim of this application.

At the same time, this application uses specific terms to describe embodiments of this application. "an embodiment", "one embodiment", and/or "embodiments" means a feature, structure or feature relevant to at least one embodiment of this application. Therefore, it should be emphasized and noted that two or more references to "one embodiment" or "an embodiment" or "an alternative embodiment" in different places in this specification do not necessarily mean the same embodiment. In addition, certain features, structures or features in one or more embodiments of this application may be appropriately combined.

What is claimed is:

1. A detection circuit for detecting a drift or an open circuit of a first capacitor on a filtered second power source terminal, the second power source terminal is suitable for acquiring a power source voltage from an unfiltered first power source terminal by means of a first resistor, and is suitable for being coupled to a reference electric potential terminal by means of the first capacitor so as to filter the power source voltage, the detection circuit comprising:
    a second resistor and a second capacitor that are connected in series and coupled between the first power source terminal and the reference electric potential terminal, wherein the second resistor and the second capacitor have a same time constant as the first resistor and the first capacitor;
    a simulated power source terminal connected between the second resistor and the second capacitor; and
    a comparator that is coupled to the second power source terminal and the simulated power source terminal and suitable for measuring a voltage difference between a filtered power source voltage of the second power source terminal and a simulated power source voltage of the simulated power source terminal, wherein the voltage difference indicates the degree of drift or the open circuit of the first capacitor.

2. The detection circuit according to claim 1, further comprising:
    a bleeder circuit that is coupled between the comparator and the second power source terminal to provide a divided voltage of the filtered power source voltage to the comparator; and
    a divider resistor that is coupled between the simulated power source terminal and the reference electric potential terminal, so that the simulated power source voltage is a divided voltage of an unfiltered power source voltage of the first power source terminal.

3. The detection circuit according to claim 2, wherein the second resistor is a variable resistor.

4. The detection circuit according to claim 3, wherein the second resistor is pre-adjusted such that the second resistor and the second capacitor have the same time constant as the first resistor and the first capacitor.

5. The detection circuit according to claim 2, further comprising a first switch for disconnecting the bleeder circuit, and a second switch for disconnecting the divider resistor.

6. The detection circuit according to claim 1, wherein the second resistor is a variable resistor.

7. The detection circuit according to claim 6, wherein the second resistor is pre-adjusted such that the second resistor and the second capacitor have the same time constant as the first resistor and the first capacitor.

8. The detection circuit according to claim 1, wherein a capacitance value of the second capacitor has a lower order of magnitude than a capacitance value of the first capacitor.

9. The detection circuit according to claim 1, wherein the detection circuit is integrated in an integrated circuit, and the first power source terminal, the second power source terminal and the reference electric potential terminal are terminals of the integrated circuit.

10. An integrated circuit, comprising:
    an unfiltered first power source terminal;
    a filtered second power source terminal that is suitable for being coupled to the first power source terminal by means of a first resistor, and coupled to a reference electric potential terminal by means of a first capacitor;
    a second resistor and a second capacitor that are connected in series and coupled between the first power source terminal and the reference electric potential terminal, wherein the second resistor and the second capacitor have a same time constant as the first resistor and the first capacitor;
    a simulated power source terminal connected between the second resistor and the second capacitor; and
    a comparator that is coupled to the second power source terminal and the simulated power source terminal, and suitable for measuring a voltage difference between a filtered power source voltage of the second power source terminal and a simulated power source voltage of the simulated power source terminal.

11. The integrated circuit according to claim 10, further comprising:
   a bleeder circuit that is coupled between the comparator and the second power source terminal to provide a divided voltage of the filtered power source voltage to the comparator; and
   a divider resistor that is coupled between the simulated power source terminal and the reference electric potential terminal, so that the simulated power source voltage is a divided voltage of an unfiltered power source voltage of the first power source terminal.

12. The integrated circuit according to claim 11, wherein the second resistor is a variable resistor.

13. The integrated circuit according to claim 12, wherein the second resistor is pre-adjusted such that the second resistor and the second capacitor have a same time constant as the first resistor and the first capacitor.

14. The integrated circuit according to claim 10, wherein the second resistor is a variable resistor.

15. The integrated circuit according to claim 14, wherein the second resistor is pre-adjusted such that the second resistor and the second capacitor have a same time constant as the first resistor and the first capacitor.

16. The integrated circuit according to claim 10, wherein a capacitance value of the second capacitor has a lower order of magnitude than a capacitance value of the first capacitor.

17. The integrated circuit according to claim 11, further comprising a first switch for disconnecting the bleeder circuit, and a second switch for disconnecting the divider resistor.

18. The integrated circuit according to claim 10, wherein the integrated circuit is an integrated circuit chip for a car.

19. The integrated circuit according to claim 10, wherein the integrated circuit is a battery controller.

* * * * *